United States Patent [19]

Chu et al.

[11] 4,156,458

[45] May 29, 1979

[54] FLEXIBLE THERMAL CONNECTOR FOR ENHANCING CONDUCTION COOLING

[75] Inventors: Richard C. Chu, Poughkeepsie; James H. Eaton, Armonk, both of N.Y.; Ralph E. Meagher, Vicksburg, Mich.

[73] Assignee: International Business Machines Corporation, Armonk, N.Y.

[21] Appl. No.: 801,893

[22] Filed: May 31, 1977

[51] Int. Cl.$^2$ ................................................ F28F 7/00
[52] U.S. Cl. ....................................... 165/81; 165/185; 357/81; 357/82
[58] Field of Search ............... 165/80, 185, DIG. 7, 165/81; 174/16 HS; 357/81, 82; 361/382, 383, 384, 385, 386, 389

[56] References Cited

U.S. PATENT DOCUMENTS

| | | | |
|---|---|---|---|
| 3,543,842 | 12/1970 | Merges | 165/185 |
| 3,545,535 | 12/1970 | Hinkens | 357/81 |
| 3,851,173 | 11/1974 | Taylor et al. | 165/185 |

OTHER PUBLICATIONS

Semi Conductor Module with Improved Air Cooling, Cain et al., IBM Tech Disclosure Bull., vol. 19, No. 5, 10-76.

Circuit Module With Heat Transfer, Ciancanelli, IBM Tech Disclosure Bull., vol. 19, No. 7, 12-76.

*Primary Examiner*—Sheldon Jay Richter
*Attorney, Agent, or Firm*—Harold H. Sweeney, Jr.

[57] ABSTRACT

A conduction heat transfer connection is made between a heat source and a heat sink which is flexible so as to adapt to variations in distance between the source and sink and which maintains the required force on the heat source to obtain the required heat transfer across the junction therebetween. The connection consists of a heat conductive metallic foil bundle of sufficient thickness to contact sufficient surface area of the heat source to provide the required heat transfer and of sufficient thinness to be flexible enough to absorb the expansion and contraction due to temperature changes as well as the differences in distance between the heat source and sink and of sufficient length to contact at or near the other end thereof the heat sink.

6 Claims, 7 Drawing Figures

MICRO-SLICING AREA

MICRO-SLICING AREA

FLEXIBLE THERMAL CONNECTOR FOR ENHANCING CONDUCTION COOLING

BACKGROUND OF THE INVENTION

1. Field of the Invention

This invention relates to an improved conduction heat transfer path between a heat source and a heat sink, and more particularly, to a heat transfer connection which is flexible so as to adapt to differences in distance between respective heat sources and the sink and which does not exceed the force limits against the heat sources.

2. Description of the Prior Art

With the miniaturized capabilities afforded by the discovery of solid state electronics, various improved means of dissipating the heat generated by solid state components have been investigated. The standard forced air convection means appears to have reached its limit of practicality in that the amount of air that is required to provide sufficient cooling for the limited heat dissipating surfaces introduces a noise problem, and without some auxiliary techniques cannot maintain each of a large number of components within its critical, narrow operating temperature range. Accordingly, especially in connection with large scale computer systems, an encapsulated cooling system has been devised which provides one or more heat dissipating electronic components encapsulated in a special cooling environment such as a low boiling point liquid or gas. U.S. Pat. No. 3,993,123, filed Oct. 28, 1975 and issued Nov. 23, 1976 shows an example of an encapsulated cooling unit for one or more heat generating components mounted on a substrate. A heat conductive cap is sealed to the substrate enclosing the heat generating components. The wall of the cap opposite the substrate contains elongated openings therein extending towards the heat generating components and on the same centers with respect thereto. A resilient member is located in the cap in communion with the inner end of the openings. A thermal conductive element is located in each of the openings forming a small peripheral gap between each opening wall and the associated thermal conductive element. The resilient member urges the thermal conductive elements into pressure contact with the heat generating components. A thermal conductive inert gas is located within the cap filling the peripheral gaps and the interfaces between the heat generating elements and the thermal conductive elements. The heat is removed from the cap by external heat removal means. The thermal conductive elements give rise to mechanical problems such as vibration, thermal expansion, and poor surface to surface contact especially when the chip surface to be contacted by the thermal conductive element is slightly tilted.

SUMMARY OF THE INVENTION

Apparatus is provided which makes a good conduction heat transfer connection between a heat source and a heat sink which is sufficiently flexible so as to adapt to variations in distance between different sources and the sink and which maintains the required force on the heat sources. The apparatus consists of a heat conductive metallic foil bundle of sufficient thickness to contact sufficient surface area of the heat source to provide the required heat transfer and which is sufficiently thin to be flexible enough to absorb differences in distance between heat sources and the sink as well as to expand and contract due to temperature changes and of sufficient length to connect to the heat sink at or near the other end thereof. A good heat transfer contact is made between the metallic foil bundle and the heat source and a good heat transfer connection is made between the metallic foil bundle and the heat sink.

The main object of the present invention is to provide a good thermal connection between a heat source and a heat sink which can be directly connected to the heat sink and which is sufficiently flexible to adjust for differences in heat source heights with respect to the heat sink and to absorb expansion and contraction without exceeding the predetermined force on the heat source.

It is another object of the present invention to provide an improved thermal path between a heat source and a heat sink which consists of a bundle of foils having one end thereof micro-sliced to form a plurality of mini-foils capable of following the contour of the heat source to thereby make a better thermal contact.

It is another object of the present invention to provide a metallic foil bundle extending between a heat source and a heat sink at an inclined angle so as to give better contact with the heat source surface.

It is a further object of the present invention to provide an improved thermal connection between a heat source and a heat sink which includes a spring loaded metallic piece having the bundle of heat conducting foils attached to a surface thereof and connected to the heat sink thereby allowing the metallic piece to adjust to any tilt of the heat source.

It is yet a further object of the present invention to provide a metallic foil bundle formed in a loop connected at one end of the loop to the heat sink and connected at the other end thereof to a metallic block which can adjust to any tilt of the heat source.

DESCRIPTION OF THE PREFERRED EMBODIMENTS

Figure 1:
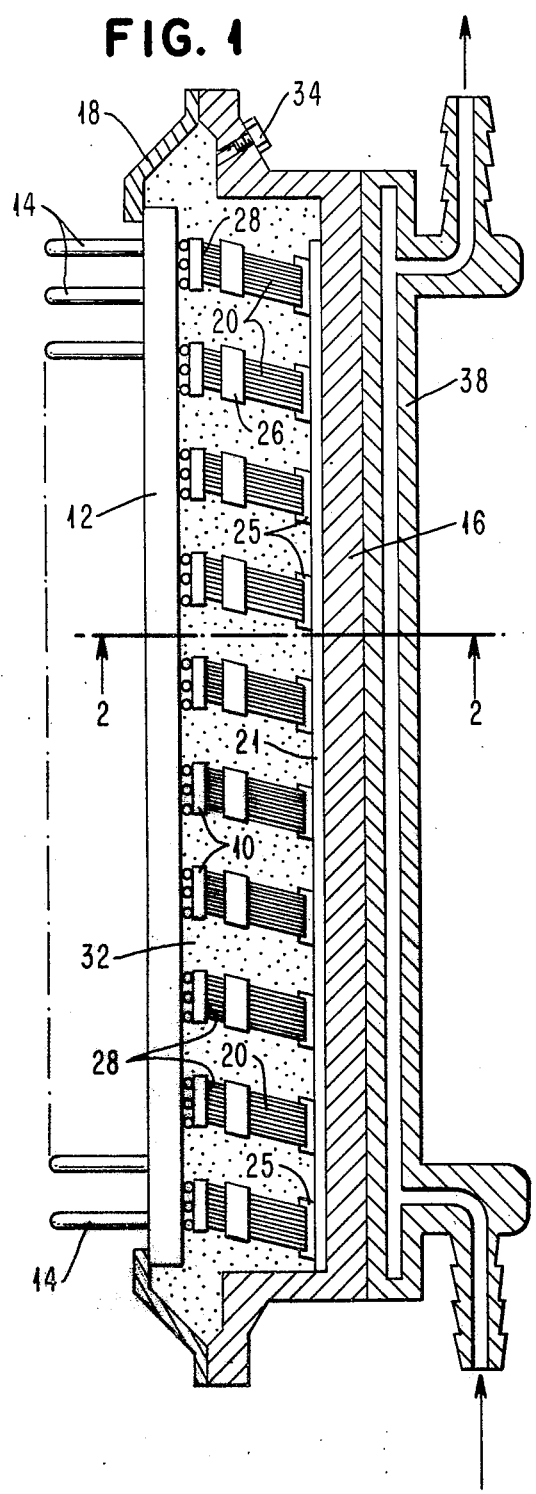
FIG. 1 is a cross-sectional diagram of an encapsulated module showing the metallic foil bundle connected between the chip and the heat sink.

Referring to FIG. 1, there is shown a cross-sectional view of a gas encapsulated module for providing cooling of the solid state electronic chips 10 to be cooled. The heat source chips 10 consist of solid state circuits and devices which are densely packed on each chip.

The power consumed within the chip generates heat which must be removed from the chip. Since the various circuits have different power requirements, and since the integrated components thereon must be maintained within certain temperature ranges for reliable operation, the cooling must be of such character as to maintain the chip temperature within the required operating range.

The chips 10 are mounted on one side of a substrate 12, generally made of ceramic, which has pins 14 extending from the other side thereof. These connecting pins 14 provide for the plugging of the module into a board (not shown) which may very well carry auxiliary circuits, etc. a container or cap 16 is attached to the substrate 12 by means of a flange 18 which extends from the periphery of the substrate 12 to the cap 16. The cap 16 is made of a good heat conductive material such as copper or aluminum. The cap 16 serves as the heat sink or part of the heat transfer path to an attached cold plate 38 or set of fins (not shown). A heat conductive metallic foil bundle 20 is provided which extends between the back surface of the chip 10 to the heat sink or cap 16. The heat conductive metallic foil bundle 20 consists of a number of foils of a good heat conductive material such as copper which are bundled together to give an end area approximately equal to that of the chip 10 being cooled. The chips 10 in the arrangement of the present embodiment are 0.180 inches square with a chip spacing on 0.335 inch centers. The bundle of foils or stack 20 was determined to be 0.140 inch square, at the contact surface with the chip 10. The cooper foils of the stacks 20 were made from high purity cooper 0.0012 inch thick. Each stack or bundle of foils 20 consists of approximately 86 individual foils. One end of the metallic foil bundle 20 is attached to a cooper or aluminum backplate 21 by soldering or the like so as to make a good thermal connection therewith. The metallic foil bundles or stacks 20 are attached to the backplate 21 at a 45° angle. It was found that an angular orientation of the metallic foil bundle 20 between the heat sink 16 and source 10 lessens the contact pressure on the chip, provides a better spring action when the foil stack is pressed against the chip surface and results in a better surface to surface contact when the chip 10 is tilted.

The foils can be bundled in long strips and the bundle attached along a long edge to the backplate 21 in spaced rows of bundles. The bundles of foils 20 are attached to the backplate 21 such that the foils extend therefrom vertically. Equally spaced cutouts are removed across the rows making cutout columns. The result is the rows now consist of equally spaced stacks 20. It should also be noted that the cutouts are at a 45° angle with respect to the backplate 21 and thus the resulting stacks 20 have a 45° angle with the backplate 21 as previously mentioned.

As can be seen in FIG. 1 the foil bundles or stacks 20 are preassembled in channels 25 which serve to hold the foils together in a bundle and also serve as the attachment channel to the backplate 21. Once the metallic foil bundles 20 are assembled to the backplate 21, the backplate can be located in the cap member 16 such that when assembled onto the substrate 12 the outer ends of the metallic foil bundles 20 will contact the surface of one of the chips 10, respectively. The lengths of the metallic bundles 20 are such that the force applied to the chips 10 is within the required amount to give a good heat transfer interface and yet not exceed the maximum force which can be applied to the chip.

Figure 3:
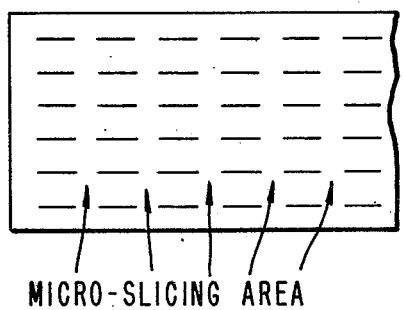
FIG. 3 is a schematic representation showing the footprint of the micro-sliced metallic foil bundle on the surface of the heat source.

In order to improve the interface between the metallic foil bundle 20 and the chip 10, micro-slicing 27 of the metallic foil bundle 20 was provided to give what appears to be small foils extending from the micro-sliced end of the metallic foil bundle 20. The micro-slicing 27 is provided in the end of the metallic foil bundle 20 which abuts the surface of the chip 10. FIG. 3 shows the footprints or contact area of the micro-sliced foil ends on the chip 10 surface. It was found that these small more flexible end sections of the metallic foil bundles 20 reduce the pressure on the chip and are better able to flex and follow any minute contours of the chip surface and also any slight tilt of the chip surface.

These mini-foils also provide a direct connection capability of the metallic foil bundle to the heat source such as a chip. The mini-foils are treated so that only the ends contacting the chip are wettable. The slots provided by the micro-slicing, which give rise to the footprint shown in FIG. 3, eliminate the excessive strain in the chip due to the direct bonding of the foils to the chip.

The metallic foil bundle 20 has an elastic sleeve 26 around the periphery of the bundle mainly to hold that end of the bundle together and to serve as protection for the individual mini-foils formed by the micro-slicing. The cap 16 has a coldplate 38 attached thereto to serve as the ultimate heat sink for the heat generated by the chip 10. In place of the cold plate 38, the cap 16 can contain cooling fins which extend into an air column where air is blown thereover.

Figure 2:
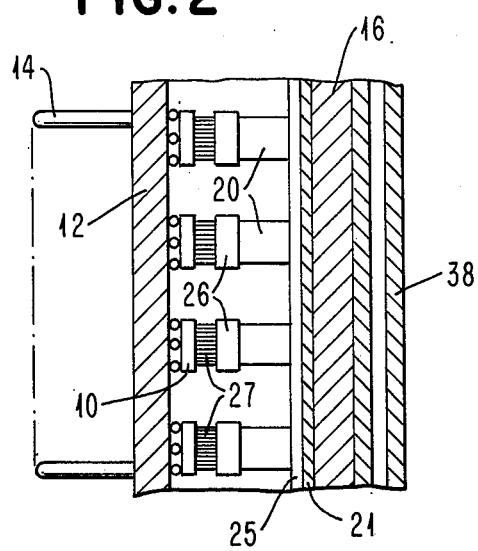
FIG. 2 is a cross-sectional view along the line 2—2 of FIG. 1 showing the micro-slices in the heat source end of the metallic foil bundle.

Referring again to FIGS. 1 and 2, the heat path can be seen as extending across the interface 28 between the metallic foil bundles 20 and the chip 10 along the metallic bundle foils 20 through the clamping track 25 and the backing plate 21 into the cap 16 and across the cap 16 into the cold plate 38 as shown. In those situations where it is desired to enhance the heat transfer characteristics across the interface 28 between the chip 10 and the metallic foil bundle 20, helium gas 32 is introduced into the open space between the substrate 12 and the cap 16 through the gas fill opening 34 shown at the top of FIG. 1. Helium gas is utilized since the gas has a low-molecular weight and thus easily fills the voids and the interface 28 between the heat source chips 10 and the metallic foil bundles 20. Another feature of the gas is that it is a good thermal conductor and, therefore, forms an interface having high heat conductivity. That is, the interface formed using helium gas has a relatively low thermal resistance. Another feature of the gas which is very important is that it is inert. By inert it is meant that the gas is electrically non-conductive, non-poisonous, non-corrosive, non-flammable, non-explosive and non-toxic. The gas also has a high adhesion quality that essentially wets the surface which it is in contact with. Other low-molecular weight gases such as hydrogen or carbon dioxide could be used. However, these gases appear to have one or more undesired properties such as the explosive nature of hydrogen. A thermal grease or the like could also be used in the interface 28 to lower the interface thermal resistance.

Figure 4:
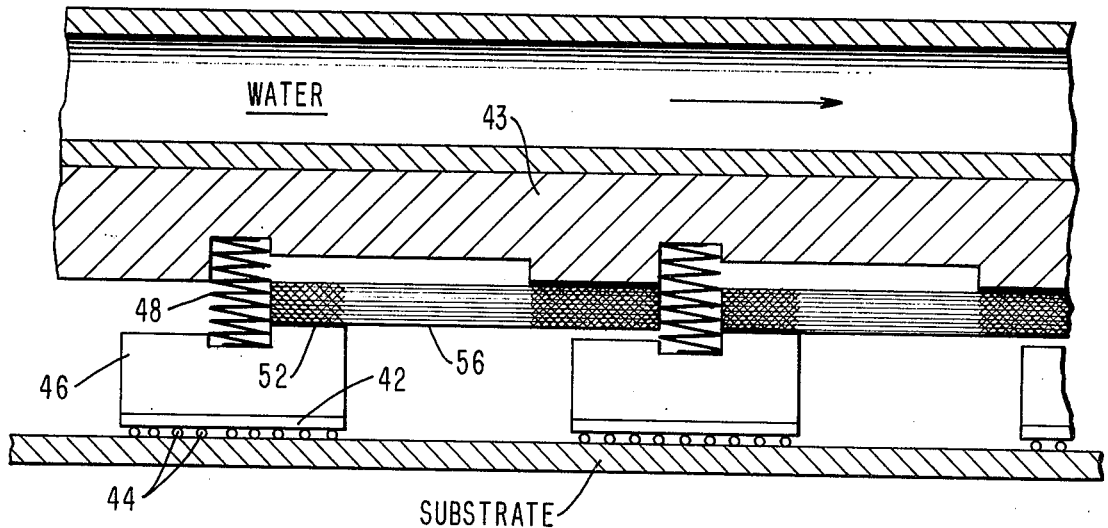
FIG. 4 is a schematic partially cross-sectioned view of the metallic foil bundle connected between the heat sink and a spring loaded metallic piece which contacts the chip surface to be cooled.
Figure 5:
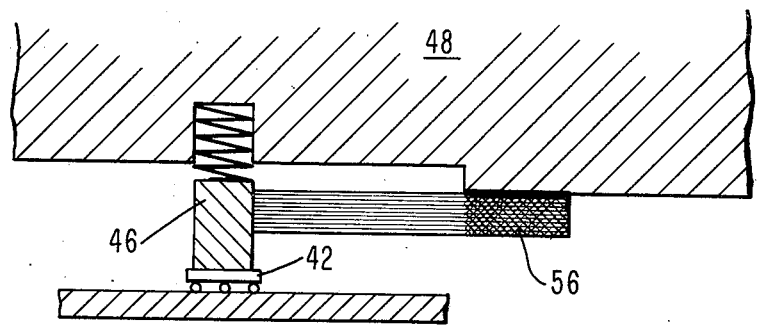
FIG. 5 is a partially cross-sectioned schematic view of the metallic foil bundle connected to the heat sink and the side of a spring loaded metallic piece which contacts the chip.

Referring to FIG. 4, there is shown another embodiment of the conduction type module containing a metallic foil bundle 56 as one of the heat transfer elements between a heat source 42 and a heat sink 43. The chip or heat source 42 is shown mounted face down via conductive solder balls 44 and the backside of the chip 42 is contacted by a copper element 46. The copper element 46 is spring loaded against the chip 42 by virtue of the spring 48 which extends between the copper backing plate or heat sink 43 and the copper element 46. The spring 48 is introduced to keep a predetermined force of the copper element 46 against the chip 42 so as to form a good thermal interface therebetween having a relatively low resistance. The copper element 46 has a top surface 52 to which the metallic foil bundle is soldered. The metallic foil bundle extends horizontally or laterally from the copper element 46 into contact with the bottom surface of the copper backing plate 43. Again the foil bundle 56 is soldered to the surface of the backing plate 43 as well as having the foils in that area soldered together. The metallic foil bundle 56 contains approximately 20 foils of 0.001 inch copper. This gives a relatively flexible cantilever spring. The metallic foil bundle 56 not only provides a good heat transfer path from the copper element 46 to the copper backing plate 43 and consequently to the ultimate heat sink, which in this case is a cold plate, but serves as a flexible element thereby allowing the copper element 46 to make a flat contact with the chip 42 surface even though the chip 42 may be slightly tilted. The interface may contain a thermal grease or the module itself may contain a helium gas both of which are capable of improving the heat transfer across the interface between the chip 42 and the copper element 46. A number of different arrangements of the metallic element 46 and the metallic foil bundle 56 are possible. For example, FIG. 5 shows the metallic piece 46 spring loaded against the heat source chip 42 and shows a metallic foil bundle 56 extending from the side of the metallic piece 46 to the heat sink 48. The metallic foil bundle 56 is shown having an end thereof soldered to the side of the metallic piece 46 with the area near the other end thereof soldered to the heat sink surface as was the case in FIG. 4. Again, the metallic foil bundle is relatively flexible, the flexibility depending on the thickness of the foils and the number of foils used in the bundle. to thereby provide a good seating of the metallic piece 46 against the chip surface. The arrangement is applicable to both single and multiple heat source as is the case in the prior embodiments. This embodiment would be used in preference to the embodiment shown in FIG. 4 in the situation where the chips are closely spaced and, accordingly, there is insufficient room to provide the flat surface in the metallic piece 46 to which the foil bundle 56 can be soldered.

Figure 6:
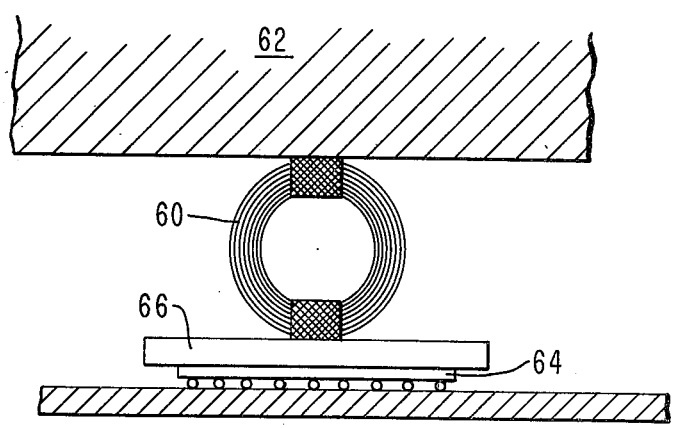
FIG. 6 is a schematic view of the metallic foil bundle connected between a heat sink and a heat generating chip wherein the metallic foil bundle is formed into a coil.

Another embodiment is shown wherein the metallic foil is formed into a coil 60 as shown in FIG. 6. The coil of one or more metallic foil bundles is formed which are cut to the right dimension so that when formed into a coil 60 it will give the appropriate connection between the heat sink 62 and the heat source 64. One section of the coil 60 is spot welded or soldered together and attached to the heat sink 62. Diametrically across the coil 60 a similar section is welded together and soldered to a metallic block 66 which is prepared to mate to the surface of the heat source chip 64. It should be appreciated that the metallic foil coil 60 is a good heat conductor to remove the heat from the heat source 64 to the heat sink 62, but is also flexible and serves as a spring to apply the desired force to the interface between the metallic block 66 and the heat source 64. The flexiblity also gives sufficient maneuverability to the metallic block 66 such that it can adapt to the chip surface even though it may be tilted. The interface between the heat source chip 64 and the metallic block 66 can be enhanced by including helium gas within the module in which the metallic foil coil type connection is utilized. Other thermal interface materials such as grease can also be utilized.

Figure 7:
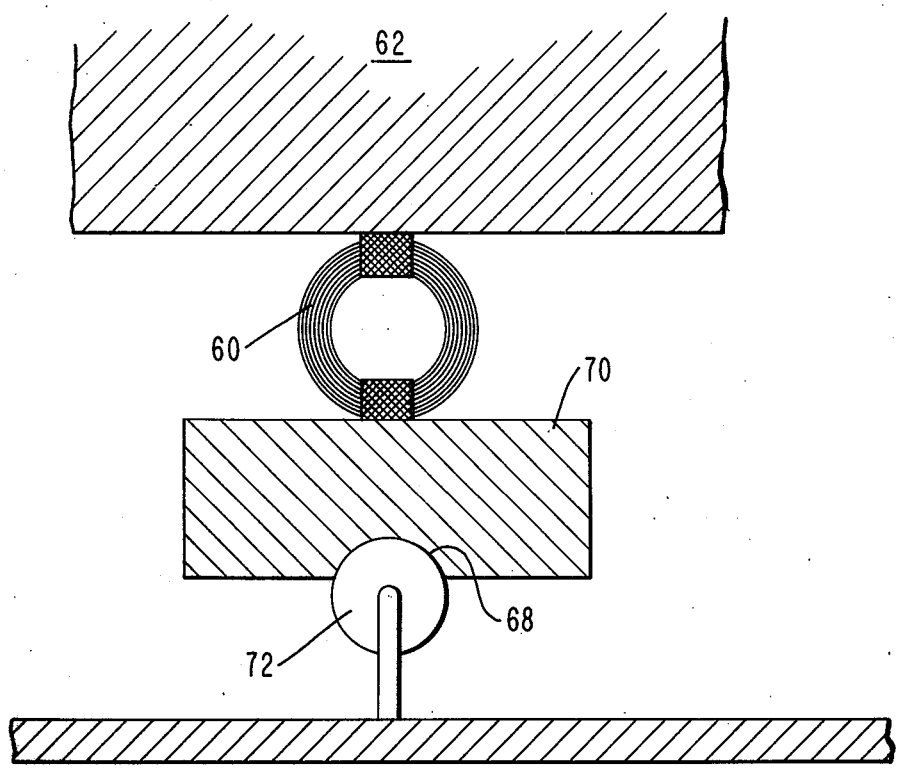
FIG. 7 is a schematic diagram showng the metallic foil coil connected to a metallic block which is adapted to contact a cylindrical heat source.

Referring to FIG. 7 there is shown another arrangement of the same metallic foil coil 60 connected between the heat sink 62 and a metallic block 70. However, the metallic block 70 instead of having a flat surface as was the case in FIG. 5, has a cylindrical cutout portion 68 therein. The heat source 72 instead of being a chip as was the case in FIG. 6 is a cylindrical heat source having the same surface curvature as the cylindrical cutout 68 in the metallic block 70. Accordingly, the metallic block 70 and the cylindrical heat source 72 mate to give a good thermal interface therebetween. Similarly, helium or other equivalent thermal interface enhancement materials such as thermal grease could be used to enhance the heat transfer across the interface. This embodiment is likewise applicable to both single and multiple heat sources.

While the invention has been particularly shown and described with reference to the embodiments thereof, it will be understood by those skilled in the art that the foregoing and other changes in form and detail may be made therein without departing from the spirit and scope of the invention.

What is claimed is:

1. A heat transfer connection between a heat source and a heat sink in a thermal conduction module which is adaptable to variations in the heat source surface and to variations in distance and tilt between the source and sink and which maintains the required force on the heat source comprising:
   a flexible heat conductive metallic foil bundle extending between the heat source and the heat sink and having an end surface area which substantially covers the facing surface area of the heat source and which flexes to adapt to heat source tilt and to absorb expansion and contraction due to temperature changes and maintains a force against the heat conductive surface to provide a good heat transfer;
   a plurality of micro-slices located in the end of said metallic foil bundle contacting said heat source said microslices extending at substantially right angles to the foils of said metallic foil bundle and extending into said bundle a small distance so as to produce a plurality of small more flexible foils which follow the variations of said heat source; and
   means for forming a good heat transfer connection between said metallic foil bundle and said heat sink.

2. A heat transfer connection between a heat source and a heat sink according to claim 1, wherein said metallic foil bundle extends between said heat source and heat sink at an acute angle so as to provide a better interface contact between said metallic foil bundle and said heat source with a smaller contact force therebetween.

3. A heat transfer connection between a heat source and a heat sink according to claim 1, wherein said metallic foil bundle is made of foils of copper and is of a thickness which is a function of spring force to be applied by said metallic foil bundle to said heat source.

4. A heat transfer connection between a heat source and a heat sink according to claim 1, wherein said means for forming a good heat transfer connection between said metallic foil bundle and said heat sink consists of soldering one end of said metallic foil bundle to said heat sink.

5. A heat transfer connection between a heat source and a heat sink according to claim 1, wherein the plurality of small more flexible foils formed in one end of the metalic foil bundle by said micro-slices are soldered to the heat source.

6. A heat transfer connection between a heat source and a heat sink according to claim 1, wherein said heat source is an electronic chip.

* * * * *

UNITED STATES PATENT AND TRADEMARK OFFICE
CERTIFICATE OF CORRECTION

PATENT NO. : 4,156,458

DATED : May 29, 1979

INVENTOR(S) : Richard C. Chu et al.

It is certified that error appears in the above—identified patent and that said Letters Patent is hereby corrected as shown below:

First page of the patent, first column, after

"[73] Assignee: International Business Machines Corporation, Armonk, New York" insert -- by said Chu and said Eaton --.

Signed and Sealed this

Fifth Day of August 1980

[SEAL]

Attest:

SIDNEY A. DIAMOND

Attesting Officer

Commissioner of Patents and Trademarks